United States Patent
Foong et al.

(10) Patent No.: US 10,018,652 B2
(45) Date of Patent: Jul. 10, 2018

(54) SHORT CONTACT IN A TESTING APPARATUS FOR WIRELESS INTEGRATED CIRCUITS

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 217 days.

(21) Appl. No.: 14/855,341

(22) Filed: Sep. 15, 2015

(65) Prior Publication Data

US 2016/0079707 A1    Mar. 17, 2016

(30) Foreign Application Priority Data

Sep. 17, 2014  (MY) ........................ PI 2014002670

(51) Int. Cl.
| | |
|---|---|
| G01R 1/04 | (2006.01) |
| G01R 31/28 | (2006.01) |
| H01R 12/70 | (2011.01) |
| H01R 13/24 | (2006.01) |
| H05K 7/10 | (2006.01) |

(52) U.S. Cl.
CPC ....... *G01R 1/0416* (2013.01); *G01R 31/2886* (2013.01); *H01R 12/7076* (2013.01); *H01R 13/24* (2013.01); *H01R 13/2407* (2013.01); *H05K 7/1069* (2013.01)

(58) Field of Classification Search
CPC ....... G01N 30/466; G01N 2035/00158; G01N 30/0005; G01N 35/028
USPC ......... 324/762.01, 500, 754.01–756.05, 761, 324/758.01, 690, 696, 715, 724, 149
See application file for complete search history.

(56) References Cited

U.S. PATENT DOCUMENTS

| | | | |
|---|---|---|---|
| 7,819,672 B2 | 10/2010 | Osato | |
| 2010/0022104 A1* | 1/2010 | Osato | .................. G01R 1/0466 439/65 |

* cited by examiner

*Primary Examiner* — Melissa Koval
*Assistant Examiner* — Trung Nguyen
(74) *Attorney, Agent, or Firm* — Maschoff Brennan

(57) ABSTRACT

An electrical contact for use in an integrated circuit testing apparatus with a very short conducting contact pin. The shortness of the contact pin is made possible due to the unique design and coupling of the contact pin with an elastomer, and both supported by a housing in such a way that the contact pin test height is brought down to 0.5 mm, while providing a deflection of 0.1 mm with is sufficient in order to provide adequate penetration to matte tin plated devices. The contact pin of this invention looks almost like the letter "F", rotated 90° to the left, so that it lies on its left side. The rectangular shaped elastomer is placed between the prongs of the "F". The bottom part of the "F" is curved upwards so that it is almost parallel to the prongs.

10 Claims, 3 Drawing Sheets

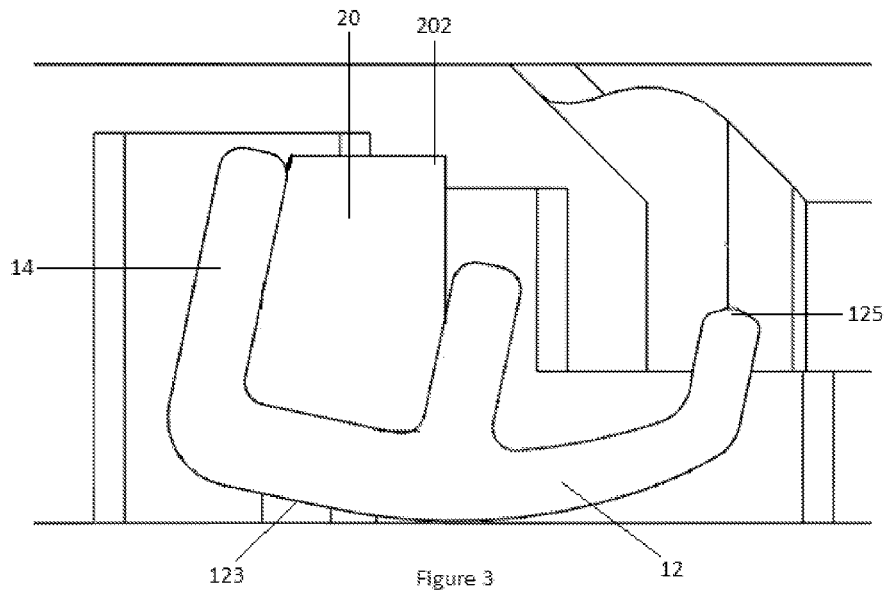
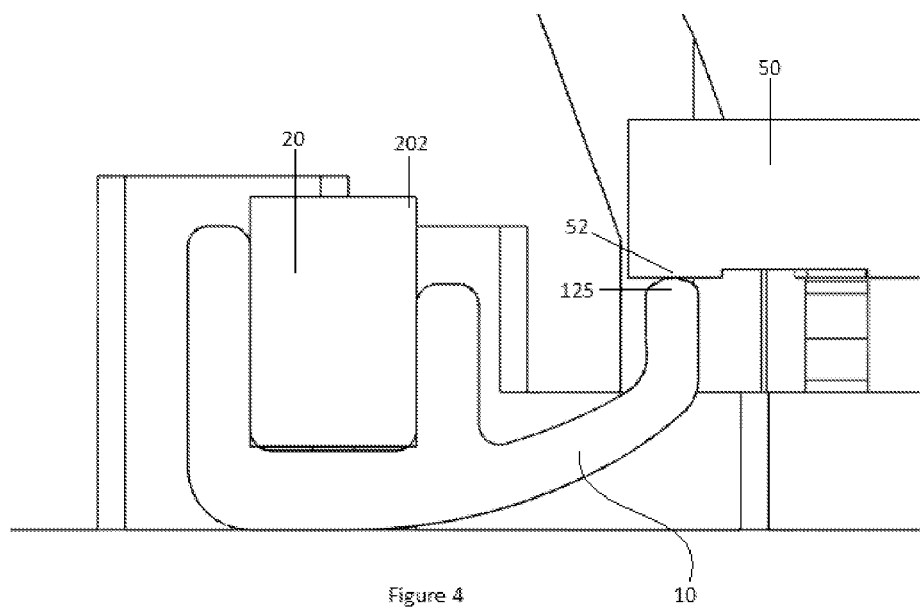

SHORT CONTACT IN A TESTING APPARATUS FOR WIRELESS INTEGRATED CIRCUITS

FIELD OF INVENTION

The present invention relates generally to electrical contacts, and more specifically to an electrical contact in an integrated circuit testing apparatus.

BACKGROUND OF INVENTION

Radio frequency (RF) semiconductor devices are changing to match the needs of increasingly innovative wireless standards. Signal bandwidths and carrier frequencies supporting greater data throughput rates are increasing over the time. This translates into increasingly complex devices, all of which need to be tested over wider operating ranges. Increased unit counts and multiple production lots are also needed to facilitate statistical correlation.

Signal integrity is the primary criteria in choosing a testing solution for RF device testing.

Many of the current solutions for testing of RF devices find it difficult to meet the required signal integrity due to various factors including the type and length of the contact used. Test contacting solutions using spring probes, which are vertical in connection comes with a longer contact, or conduction, length. The spring probe also comprises a multiple element assembly and this, along with the longer contact length, affects the signal integrity in a negative way.

Another important consideration is the length of the imprint. The length of the imprint is the summation of the length of the contact patch of the contact pin with the contact pad of the device being tested, and the wiping stroke. For very small or irregular sized contact pads, such as corner chamfer or dimple pads, it is crucial to have a short imprint. Solutions such as U.S. Pat. No. 7,819,672 (Osato) have long wiping strokes, which translates into long imprints, and is unsuitable for short or irregular contact pads.

In general, having longer contact pins used in the testing apparatus translates into poorer signal integrity. Also, having a shorter imprint allows testing of devices with smaller contact pads, as well as irregular contact pads as in the case of corner chamfer and dimple pads.

What is needed in the art is a RF device testing apparatus that maintains good signal integrity and is able to test devices with very small contact pads, or atypically shaped pads such as in corner chamfer and dimple pads.

SUMMARY OF INVENTION

The present invention seeks to overcome the aforementioned disadvantages by providing an electrical contact for use in an integrated circuit testing apparatus with a very short rigid contact pin with a short wiping stroke. The shortness of the contact pin is made possible due to the unique design and coupling of the contact pin with an elastomer, and both supported by a housing in such a way that the contact pin test height is brought down to 0.5 mm, whilst providing a deflection of 0.1 mm, which is sufficient in order to provide adequate penetration to matte tin plated devices, and an imprint (contact surface+wiping stroke) of only around 50 microns. The contact pin of this invention looks almost like the letter "F", rotated 90° to the left, so that it lies on its left side. The rectangular shaped elastomer is placed between the prongs of the "F". The bottom part of the "F" is curved upwards so that it is almost parallel to the prongs. It is the end of this bottom part of the "F" that comes into contact with the electrical contact pads of the device that is being tested. The left side of the "F" on which it is lying on is the part that contacts the testing apparatus. A housing supports the elastomer at the top right corner of the elastomer (at the corner of the elastomer that is above the middle prong of the contact pin). The bottom of the contact pin (which is the left side of the "F") is supported by its contact with the testing apparatus.

This invention thus relates to an electrical contact for use in an integrated circuit testing apparatus. A rigid member that comprises a first member joined perpendicularly to both a second and a third member, so that all three members form what looks like the letter "F", with the first member being the long, left stroke or the "F", the second member being the top stroke of the "F", and the third member being the middle stroke of the "F". In operation, the "F" of the contact pin is rotated 90° to the left, so that it lies on its left side. Thus, the second member is joined to an upper side of said first member and close to or at a first end of said first member. The third member is joined to an upper side of said first member at an intermediate point along said first member. The first member is shaped upwards at a second intermediate point of first member, such that a second end of first member is substantially pointing upwards. An elastomer, or compressible member, is supported in a space formed between said second member and said third member. A housing supports said compressible member via contact with an upper side of said compressible member. A contact pad of a testing apparatus supports said rigid member via contact with part of a lower side of said first member.

The present invention also relates to an electrical contact for use in an integrated circuit testing apparatus wherein the said second end of first member is substantially parallel to said second and third members.

The present invention also relates to an electrical contact for use in an integrated circuit testing apparatus wherein there is sufficient free space to the left of said second member such that when said second end of first member is pressed downwards, the resulting movement of said rigid member does not cause said second member to come into contact with any external surfaces.

The present invention also relates to an electrical contact for use in an integrated circuit testing apparatus wherein there is sufficient free space to the right of said third member such that when said second end of first member is pressed downwards, the resulting movement of said rigid member does not cause said third member to come into contact with any external surfaces.

The present invention also relates to an electrical contact for use in an integrated circuit testing apparatus wherein the compressible member has a rectangular cross-section, and is made of rubber.

The present invention also relates to an electrical contact for use in an integrated circuit testing apparatus wherein the second member is longer than the third member.

The present invention also relates to an integrated circuit testing apparatus that employs the electrical contacts described above arranged around a square configuration, and a housing made of an engineered plastic such as Torlon.

Other objects and advantages will be more fully apparent from the following disclosure and appended claims.

BRIEF DESCRIPTION OF DRAWINGS

FIG. 3 shows a front view of an electrical contact in a compressed state in an embodiment of the present invention.

FIG. 4 shows a front view of an electrical contact in contact with a device contact pad in an embodiment of the present invention.

DETAILED DESCRIPTION OF INVENTION

Figure 1:
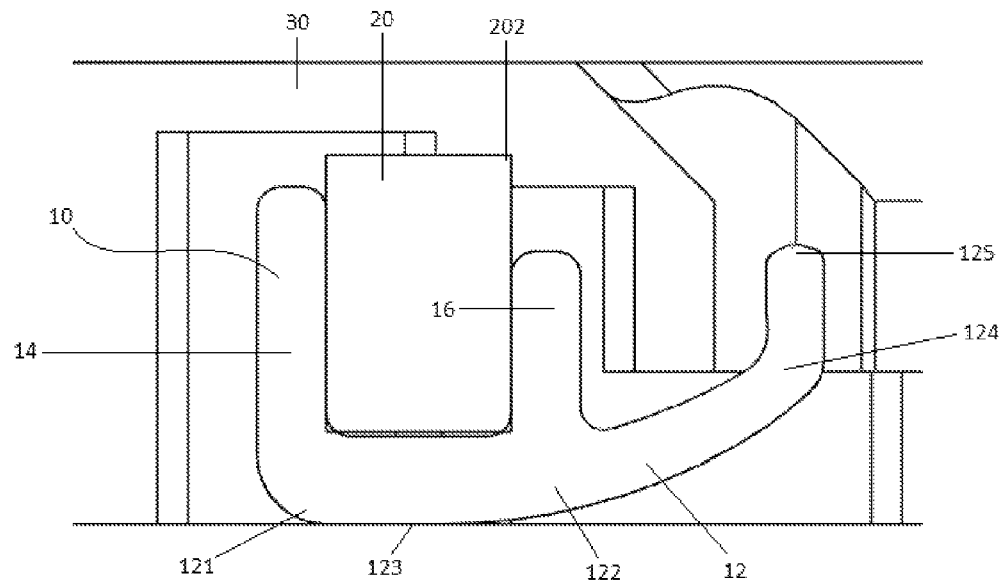
FIG. 1 shows a front view of an electrical contact in an initial state in an embodiment of the present invention.
Figure 2:
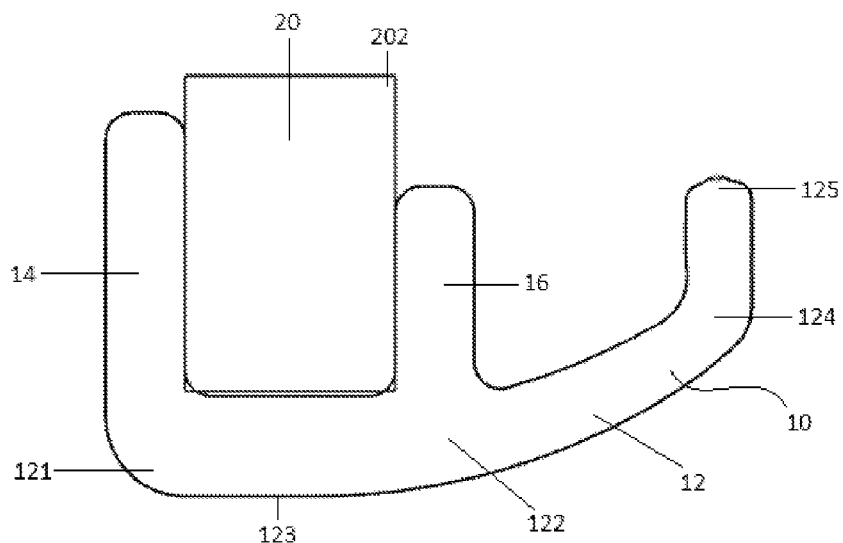
FIG. 2 shows a front view of an electrical contact without a housing in an embodiment of the present invention.

It should be noted that the following detailed description is directed to an electrical contact of an integrated circuit testing apparatus, and is not limited to any particular size or configuration but in fact a multitude of sizes and configurations within the general scope of the following description.

LIST OF NUMBERED ELEMENTS IN FIGURES

Rigid member (10)
First member (12)
First end of first member (121)
First intermediate point of first member (122)
Lower side of first member (123)
Second intermediate point of first member (124)
Second end of first member (125)
Second member (14)
Third member (16)
Compressible member (20)
Device guide (30)
Socket housing (40)
Device being tested (50)
Electrical contact pad of device being tested (52)

Referring to FIGS. 1 through 4, there is shown an electrical contact for use in an integrated circuit testing apparatus. A rigid member (10) that comprises a first member (12) joined perpendicularly to both a second (14) and a third (16) member, so that all three members form what looks like the letter "F", with the first member (12) being the long, left stroke or the "F", the second member (14) being the top stroke of the "F", and the third (16) member being the middle stroke of the "F". In operation, the "F" of the contact pin is rotated 90° to the left, so that it lies on its left side. Thus, the second member (14) is joined to an upper side of said first member (12) and close to or at a first end (121) of said first member. The third member (16) is joined to an upper side of said first member at an intermediate point (122) along said first member. The first member (12) is bent upwards at a second intermediate point (124) of first member, such that a second end (125) of first member is substantially pointing upwards. An elastomer, or compressible member (20) is supported in a space formed between said second member (14) and said third member (16). A housing (30) supports said compressible member (20) via contact with an upper side (202) of said compressible member (20), and a contact pad of a testing apparatus supports said rigid member (10) on a lower side (123) of said first member.

FIG. 3 in particular shows the electrical contact when a load presses down onto the second end (125) of first member (12). During operation, this load comes from a device (50) that is being tested, the said device lowered down onto the said second end (125) so that the said second end is pressed downwards. The rigid member (10) then rocks to the right, on said lower side (123) of first member. The compressible member (20) is thus compressed against said housing (30). When the device (50) is lifted off the second end (125), the compressible member (20) decompresses and pushes said first end (121) of first member back down, and so the rigid member (10) and compressible member (20) returns to their initial states.

Still referring to FIGS. 1 through 4, there is shown that there is sufficient free space to the left of said second member (14) such that it is free to move when said second end (125) of first member is pressed downwards, and results in movement of said rigid member (10). There is sufficient free space to the right of said third member (16) such that it moves freely when said second end (125) of first member is pressed downwards, and results in movement of said rigid member (10).

Figure 5:
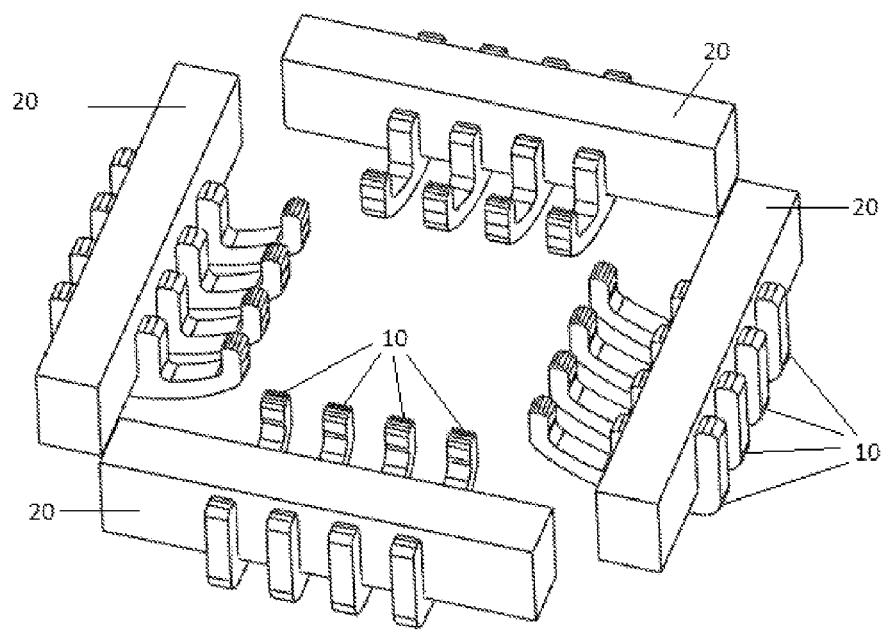
FIG. 5 shows an exploded view of a plurality of electrical contacts arranged in a square configuration in an embodiment of the present invention.

Referring to FIG. 5, there is shown a view of a plurality of electrical contacts of this invention in a typical configuration. The housing is not shown in this view, but is necessary for proper operation. Each series of four rigid members (10) is held together by a single compressible member (20). There may be any number of rigid members (10) arranged in this fashion to a single compressible member (20), and in turn a number of compressible members (20) arranged in a square as shown, or other suitable shape, depending on the testing requirements.

Figure 6:
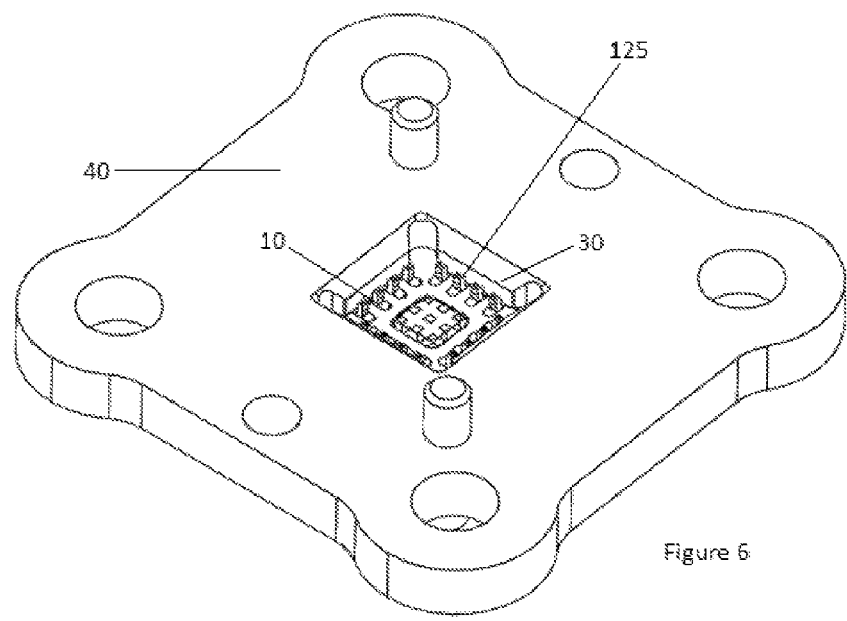
FIG. 6 shows a perspective view of an integrated circuit testing apparatus in an embodiment of the present invention.

FIG. 6 shows a complete assembly of a testing apparatus of this invention. An assembly of the rigid members (10) and compressible members (20) is assembled into a socket housing (40), said socket housing having an opening at its center, along with a device guide (30) to allow devices that are being tested to be lowered accurately onto the said second ends (125) of first members.

In a preferred embodiment, the compressible member (20) has a rectangular cross-section, and is made of silicon rubber.

In a preferred embodiment, the said second end (125) of first member (12) is substantially parallel to said second (14) and third (16) members.

In another preferred embodiment, the second member (14) is longer than the third member (16).

In a preferred embodiment, the said housing is made of an engineered plastic such as Torlon.

While several particularly preferred embodiments of the present invention have been described and illustrated, it should now be apparent to those skilled in the art that various changes and modifications can be made without departing from the spirit and scope of the invention. Accordingly, the following claims are intended to embrace such changes, modifications, and areas of application that are within the scope of this invention.

The invention claimed is:

1. An electrical contact for use in an integrated circuit testing apparatus, comprising:
   a rigid member comprising a first member joined perpendicularly to both a second member and a third member, said second member joined to an upper side of said first member and close to or at a first end of said first member, and said third member also joined to an upper side of said first member at an intermediate point along said first member, and said first member being bent upwards at an intermediate point of first member such that a second end of first member is substantially pointing upwards;
   a compressible member supported in a space formed between said second member and said third member; and a housing supporting said compressible member via contact with an upper side of said compressible member, and a contact pad of a testing apparatus supporting said rigid member on a lower side of said first member.

2. An electrical contact for use in an integrated circuit testing apparatus according to claim 1, wherein the said second end of first member is substantially parallel to said second and third members.

3. An electrical contact for use in an integrated circuit testing apparatus according to claim 1, wherein there is sufficient free space to the left of said second member such that when said second end of first member is pressed downwards, the resulting movement of said rigid member does not cause said second member to come into contact with any external surfaces.

4. An electrical contact for use in an integrated circuit testing apparatus according to claim 1, wherein there is sufficient free space to the right of said third member such that when said second end of first member is pressed downwards, the resulting movement of said rigid member does not cause said third member to come into contact with any external surfaces.

5. An electrical contact for use in an integrated circuit testing apparatus according to claim 1, wherein said compressible member has a rectangular cross-section.

6. An electrical contact for use in an integrated circuit testing apparatus according to claim 1, wherein said compressible member is made of silicon rubber.

7. An electrical contact for use in an integrated circuit testing apparatus according to claim 1, wherein second member is longer than the third member.

8. An integrated circuit testing apparatus comprising a plurality of said electrical contacts of claim 1 arranged around a square configuration.

9. An integrated circuit testing apparatus according to claim 8, wherein the said housing is made of an engineered plastic.

10. An integrated circuit testing apparatus according to claim 9, wherein the said engineered plastic is Torlon.

* * * * *